United States Patent
Huang

(10) Patent No.: US 8,158,999 B2
(45) Date of Patent: Apr. 17, 2012

(54) REINFORCED CHIP PACKAGE STRUCTURE

(75) Inventor: Wen-Huo Huang, Cyonglin Township, Hsinchu County (TW)

(73) Assignee: Sung Jung Minute Industry Co., Ltd., Cyonglin Township, Hsinchu County (TW)

( * ) Notice: Subject to any disclaimer, the term of this patent is extended or adjusted under 35 U.S.C. 154(b) by 190 days.

(21) Appl. No.: 12/401,626

(22) Filed: Mar. 11, 2009

(65) Prior Publication Data
US 2009/0230423 A1    Sep. 17, 2009

(30) Foreign Application Priority Data

| Mar. 14, 2008 | (TW) | 97108948 A |
| Mar. 14, 2008 | (TW) | 97108949 A |
| Mar. 14, 2008 | (TW) | 97108950 A |

(51) Int. Cl.
H01L 33/00 (2010.01)
F21S 6/00 (2006.01)

(52) U.S. Cl. ........ 257/99; 257/E33.057; 362/257

(58) Field of Classification Search ........ 257/79, 257/81, 99, 100, E33.057, 666, 676, 731; 362/257, 294, 800
See application file for complete search history.

(56) References Cited

U.S. PATENT DOCUMENTS

| 6,501,156 | B1 | 12/2002 | Nakanishi | |
| 6,552,368 | B2* | 4/2003 | Tamai et al. | 257/98 |
| 6,943,433 | B2 | 9/2005 | Kamada | |
| 6,975,513 | B2 | 12/2005 | Chen | |
| 2004/0201025 | A1* | 10/2004 | Barnett et al. | 257/79 |
| 2007/0228387 | A1 | 10/2007 | Negley | |

* cited by examiner

*Primary Examiner* — A. Sefer
*Assistant Examiner* — Nikolay Yushin
(74) *Attorney, Agent, or Firm* — Muncy, Geissler, Olds & Lowe, PLLC

(57) ABSTRACT

A reinforced chip package structure includes a light emitting element, a base, and a package member. The base has a base deck and a jutting bearing deck on the base deck to hold the light emitting element. The base deck and the bearing deck are interposed by an elevation difference section. On the elevation difference section, there is an annular retaining structure. The package member is located on the base and covers at least the bearing deck and the retaining structure. The package member has an anchor structure corresponding to the retaining structure. The retaining structure and the anchor structure are coupled together to harness the base and the package member from moving against each other. Thus the base and package member form a reinforced bonding between them without separating from each other when subject to external forces, therefore provide improved protection for the light emitting element.

20 Claims, 9 Drawing Sheets

REINFORCED CHIP PACKAGE STRUCTURE

FIELD OF THE INVENTION

The present invention relates to a chip package structure and particularly to a chip package structure that has a reinforced bonding between package material and a base.

BACKGROUND OF THE INVENTION

Lighting-emitting diode (LED) is a solid state light emitting element. By applying a positive voltage to a semiconductor chip to create an electroluminescent effect, the monochromatic and discrete light can be generated. At the beginning, the LED was mostly used for signal light or display panels. With advance of technology on white light LED, now it can also be used on illumination. Incorporated with technology progress of material and manufacturing process, now the LED can compete with conventional lighting devices (such as incandescent lamps, fluorescent lamps, cold cathode fluorescent lamps and the like), and increasingly displaces them in many applications.

In the conventional LED technologies, such as U.S. Pat. No. 6,975,513 and U.S. patent application No. 20070228387, a light emitting chip is soldered on a heat dissipating base. In addition to holding the light emitting chip in a contact manner, the heat dissipating base also disperses heat generated by the light emitting chip. The bonded chip and base have to go through a packaging process to protect the chip and conductive wires connecting externally. The package material generally is transparent such as Epoxy or Silicone gel. It has to meet bonding and light penetration requirements, and also has to be solidified easily to form a curved surface to control light radiation direction and angle. However, the package material and heat dissipating base are two different types of materials with different characteristics, their contact surfaces are parallel, hence the package material and the base are separated easily and result in package defects. In serious conditions, the chip could be damaged and product yield drops.

U.S. Pat. Nos. 6,943,433 and 6,501,156 also provide other package techniques that have a heat dissipating base with a boss formed thereon to bond package material. The boss is formed in one direction on the heat dissipating base. While it can harness the package material from separating the heat dissipating base, it does not provide turning resistance of the package material relative to the base when a torsional force is applied. As the chip and conductive wires are fixedly held in the package material, in the event that a relative turning occurs to the package material and base, the structure of the chip and conductive wires could be damaged and also result in product defects.

SUMMARY OF THE INVENTION

The primary object of the present invention is to solve the aforesaid disadvantages by providing a reinforced chip package structure to enhance bonding of the package material and the base.

To achieve the foregoing object, the package structure according to the invention includes a light emitting element, a base and a package member. The base has a base deck and a jutting bearing deck on the base deck to hold the light emitting element. There is an elevation difference section formed between the base deck and the bearing deck. The elevation difference section has an annular retaining structure formed thereon. The package member is located on the base and covers at least the bearing deck and the retaining structure. The package member also has an anchor structure corresponding to the retaining structure. The retaining structure and the anchor structure are coupled together to harness the base and the package member from moving against each other.

With the retaining structure and the anchor structure coupled together, a firm bonding is formed between the package member and the base in the reinforced chip package structure of the invention.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
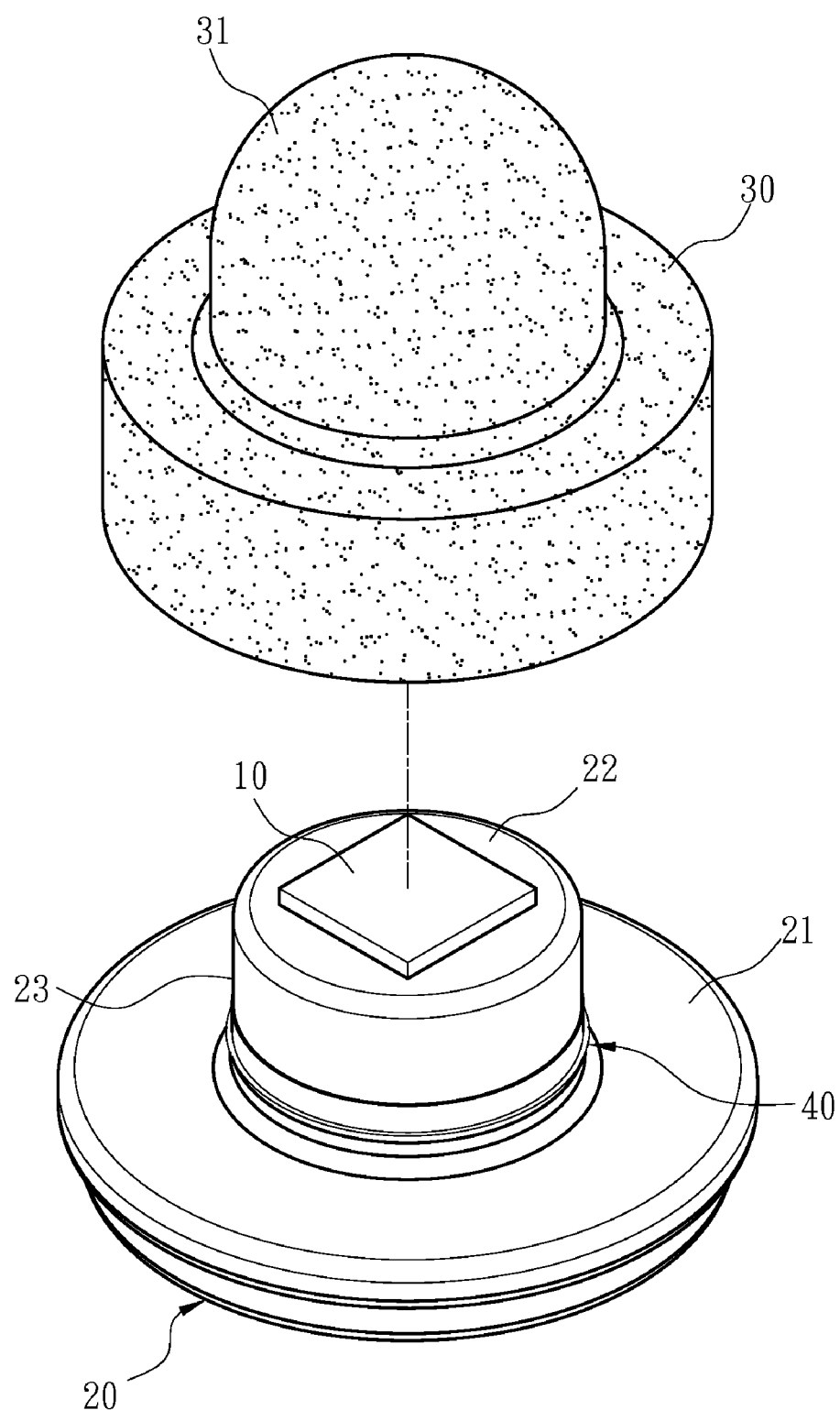
FIG. 1 is a perspective view of a first embodiment of the invention.
Figure 2A:
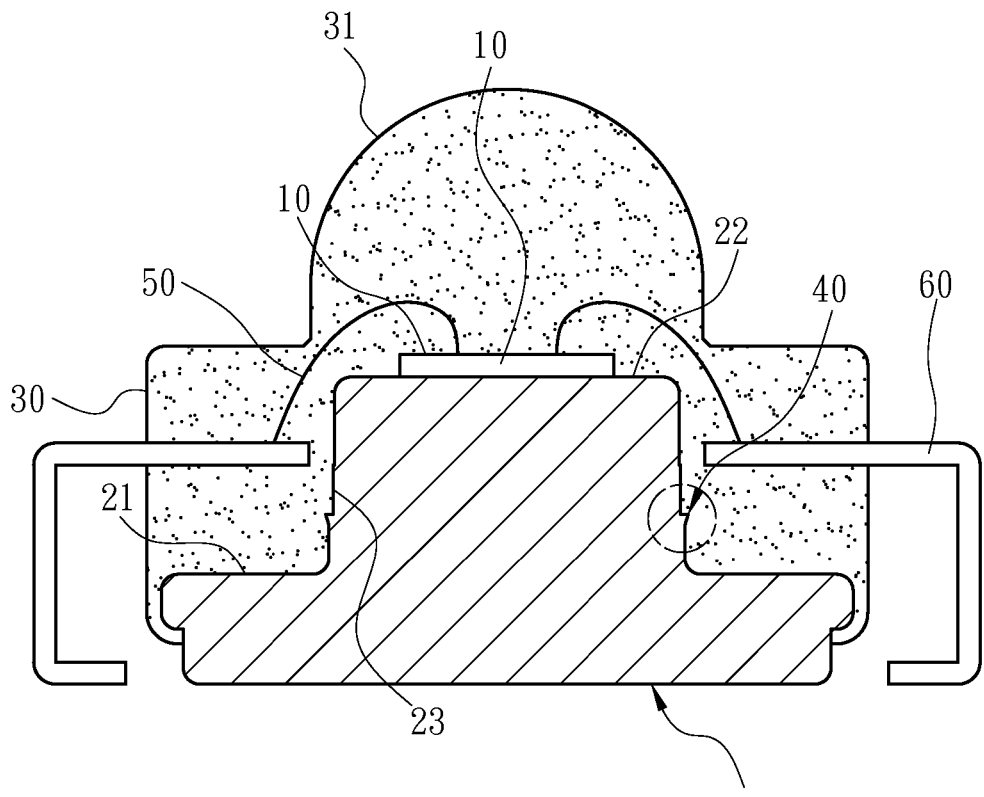
FIG. 2A is a sectional view of the first embodiment of the invention.
Figure 2B:
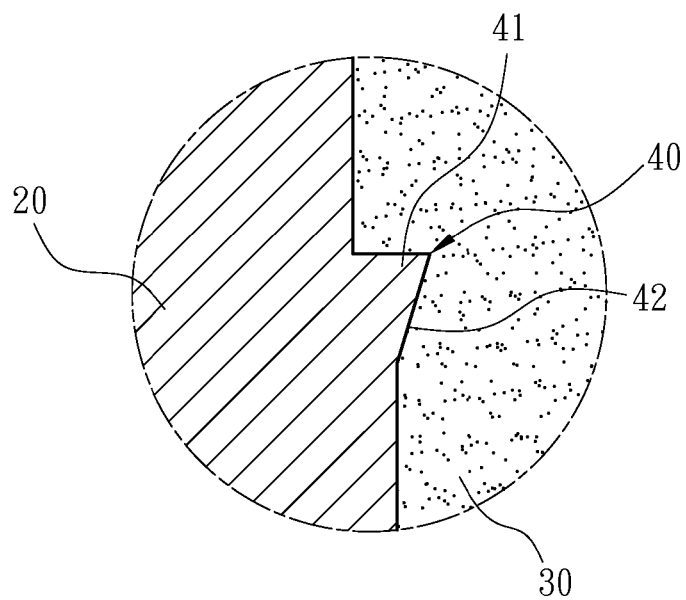
FIG. 2B is a fragmentary enlarged cross section of the first embodiment of the invention.

Please refer to FIG. 1 for a first embodiment of the invention. The reinforced chip package structure according to the invention includes a light emitting element 10, a base 20 and a package member 30. The base 20 has a base deck 21 and a jutting bearing deck 22 on the base deck 21 to hold the light emitting element 10. There is an elevation difference section 23 formed between the base deck 21 and the bearing deck 22. The elevation difference section 23 has an annular retaining structure 40 formed thereon. The package member 30 is located on the base 20 and covers at least the bearing deck 22 and the retaining structure 40, and has an anchor structure corresponding to the retaining structure 40. The anchor structure mates the profile of the retaining structure 40, but does not have a specific shape. Referring to FIGS. 2A and 2B, the retaining structure 40 and the anchor structure are coupled together to harness the base 20 from moving against the package member 30. This is the basic construction of the invention. There is also a lens portion 31 on the package member 30 corresponding to the light emitting element 10 to direct light generated thereof.

Figure 9:
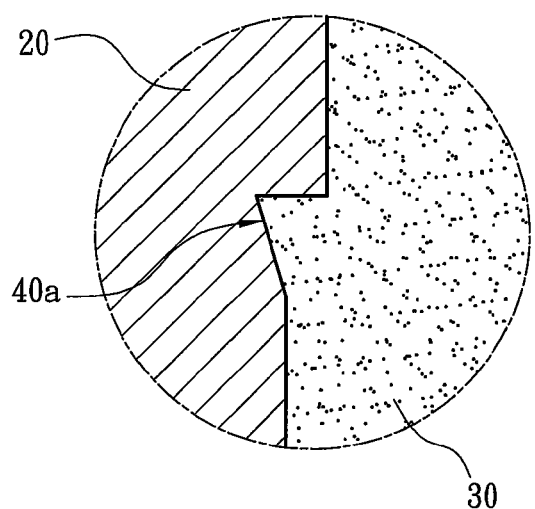
FIG. 9 is a fragmentary enlarged cross section of the fourth embodiment of the invention.

As shown in FIGS. 2A and 2B, in the first embodiment, the retaining structure 40 surrounding the elevation difference 23 has an annular ridge. In the drawings, the annular ridge has a lower edge 42 directing towards the base deck 21 and an upper edge 41 directing towards the bearing deck 22. The upper edge 41 has a greater cross section area than the lower edge 42. The invention also includes conductive pins 60 to form electrical connection with an external power supply. The conductive pins 60 are generally external electrical contact points of the invention. The conductive pins 60 and light emitting element 10 are bridged by a conductive wire 50 to form electrical connection. Also referring to FIG. 3, in the first embodiment, the bearing deck 22 also has a holding trough 24 to hold the light emitting element 10. Referring to FIG. 9 the drawing shows the fourth embodiment. Beside the annular ridge described above, the retaining structure 40a surrounding the elevation difference section 23 alternatively has an annular groove.

Figure 3:
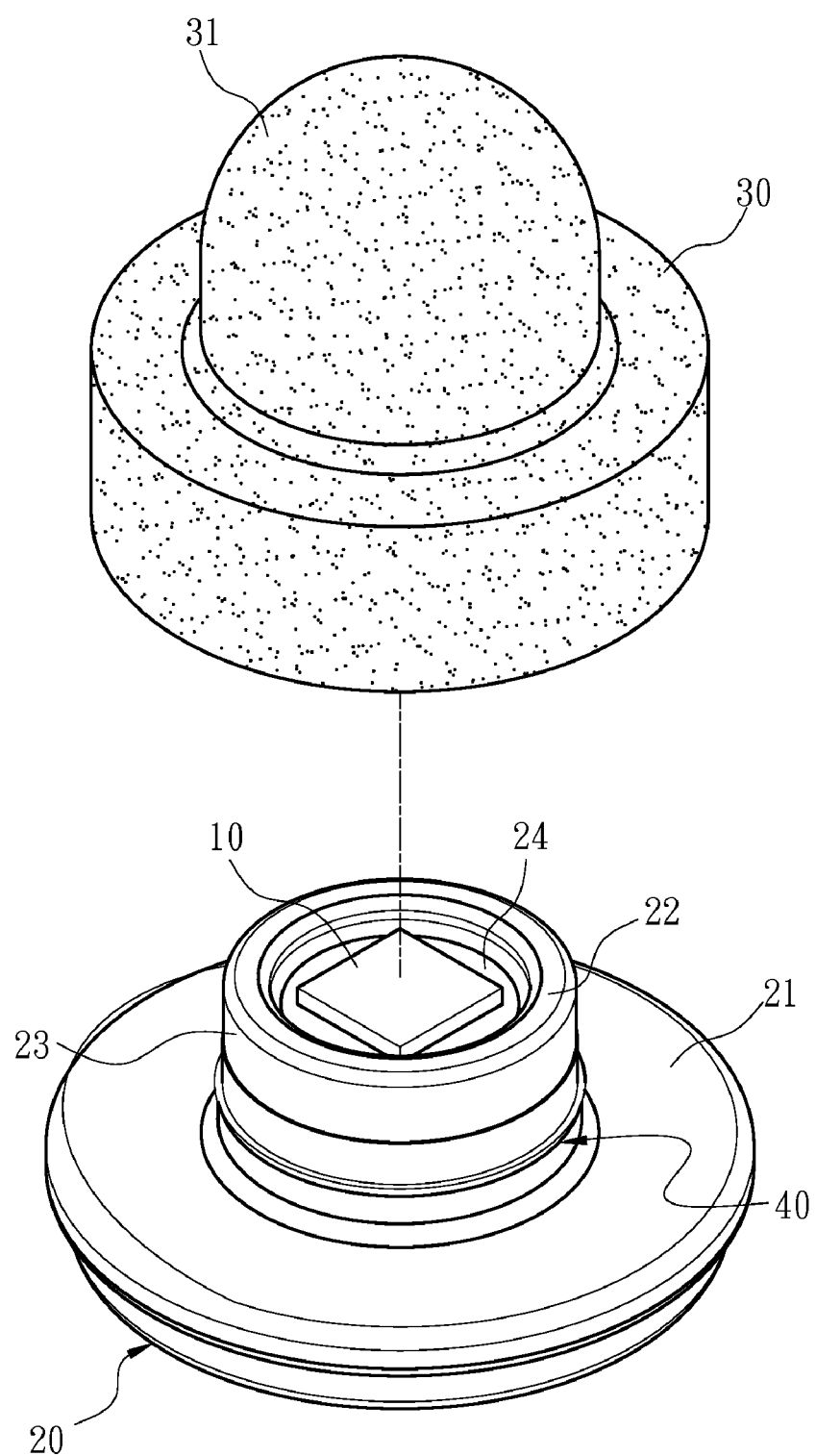
FIG. 3 is a perspective view of a holding trough of the first embodiment of the invention.
Figure 4:
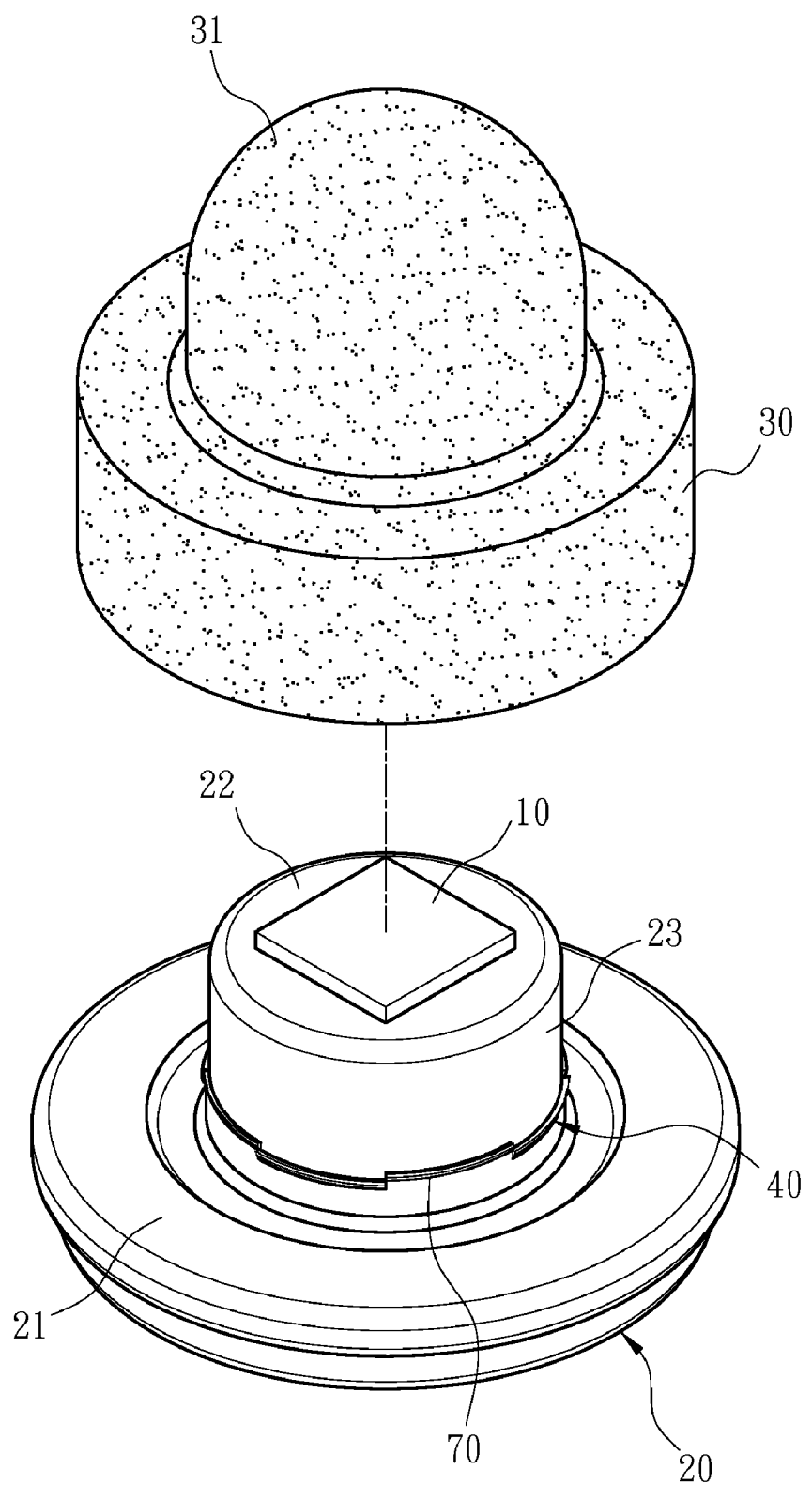
FIG. 4 is a perspective view of a second embodiment of the invention.
Figure 5A:
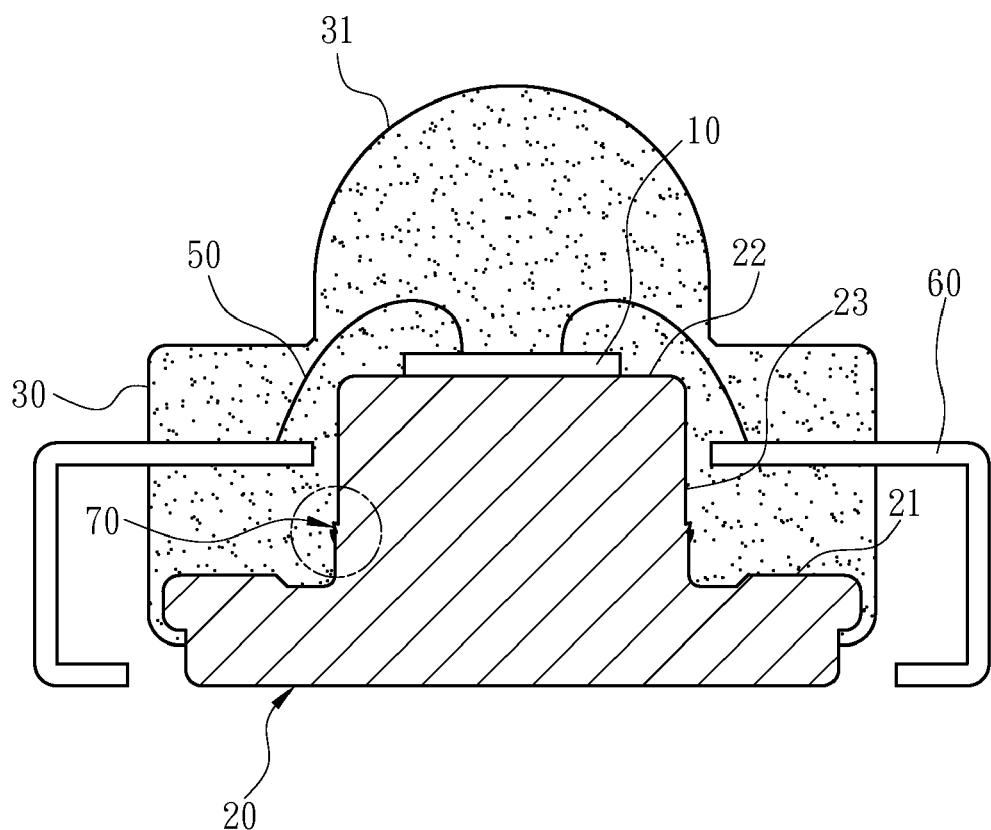
FIG. 5A is a sectional view of the second embodiment of the invention.
Figure 5B:
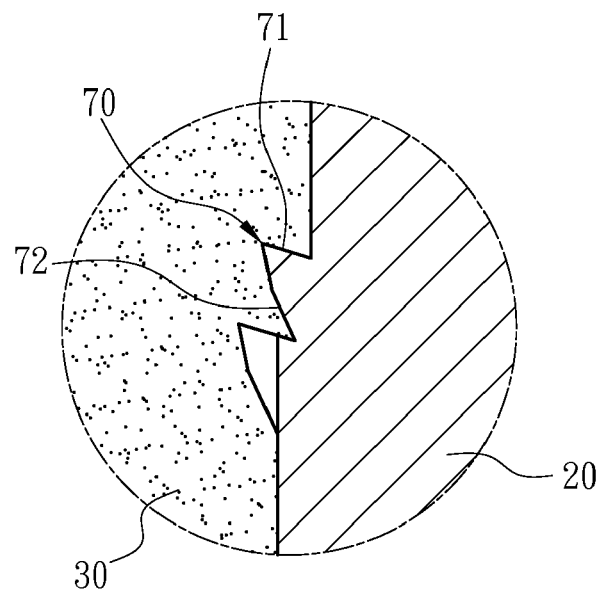
FIG. 5B is a fragmentary enlarged cross section of the second embodiment of the invention.

The invention also provides other types of embodiments. FIG. 4 illustrates a second embodiment of the invention. In this embodiment, the retaining structure 40 has at least two wedge members 70 that are separated and located at different horizontal levels. The wedge members 70 have distal ends formed on the same vertical surface. As shown in the drawing, each of the wedge members 70 is formed in an arched shape extending outwards. However, this is not the limitation. They also can be formed in arched grooves. Also referring to FIGS. 5A and 5B, each wedge member 70 has a lower edge 72 directing towards the base deck 21 and an upper edge 71 directing towards the bearing deck 22. The upper edge 71 has a greater cross section area than the lower edge 72. Referring to FIG. 3, the bearing deck 22 also can have a holding trough 24 to hold the light emitting element 10 as previously discussed.

Figure 6:
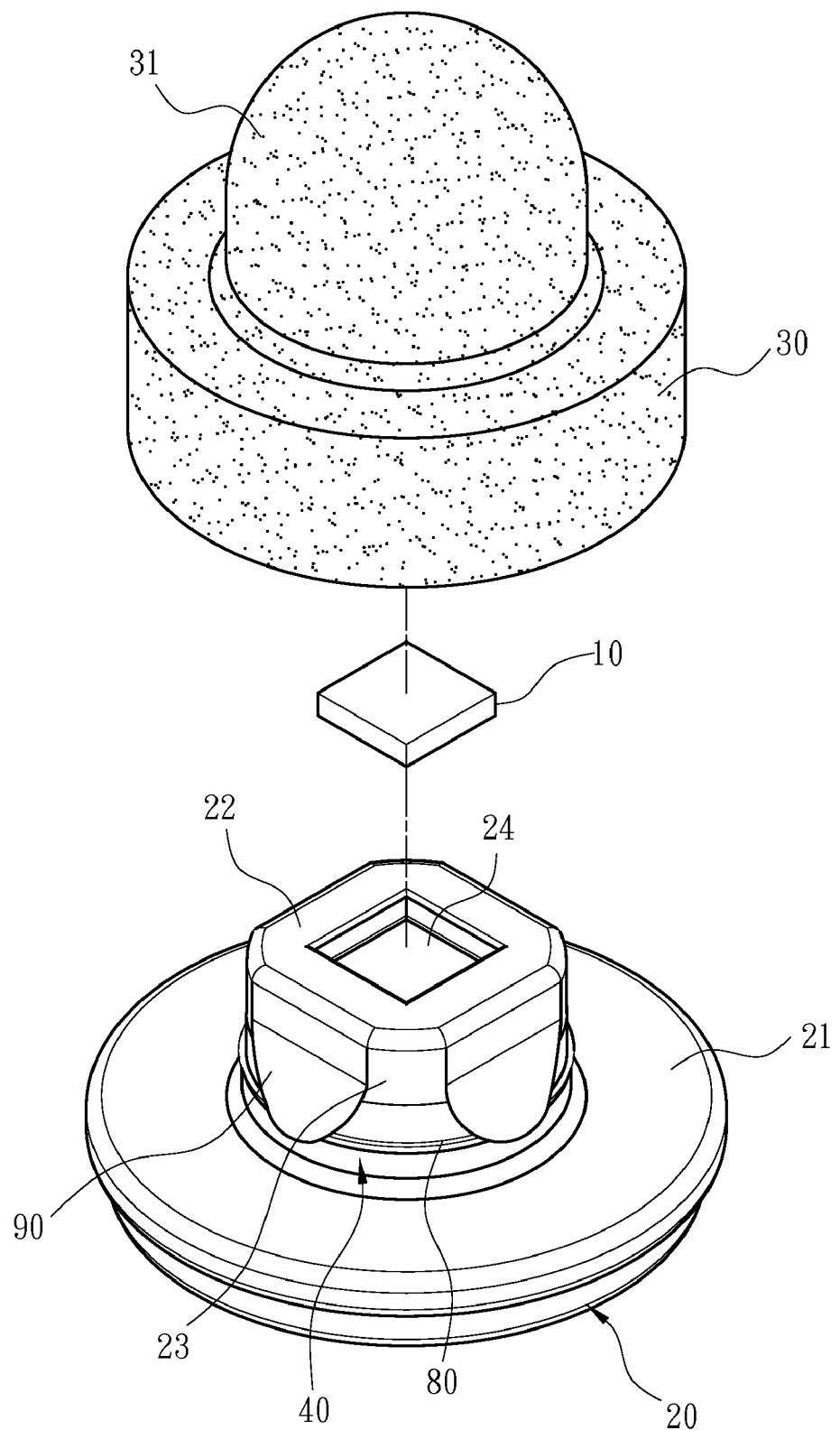
FIG. 6 is a perspective view of a third embodiment of the invention.
Figure 7A:
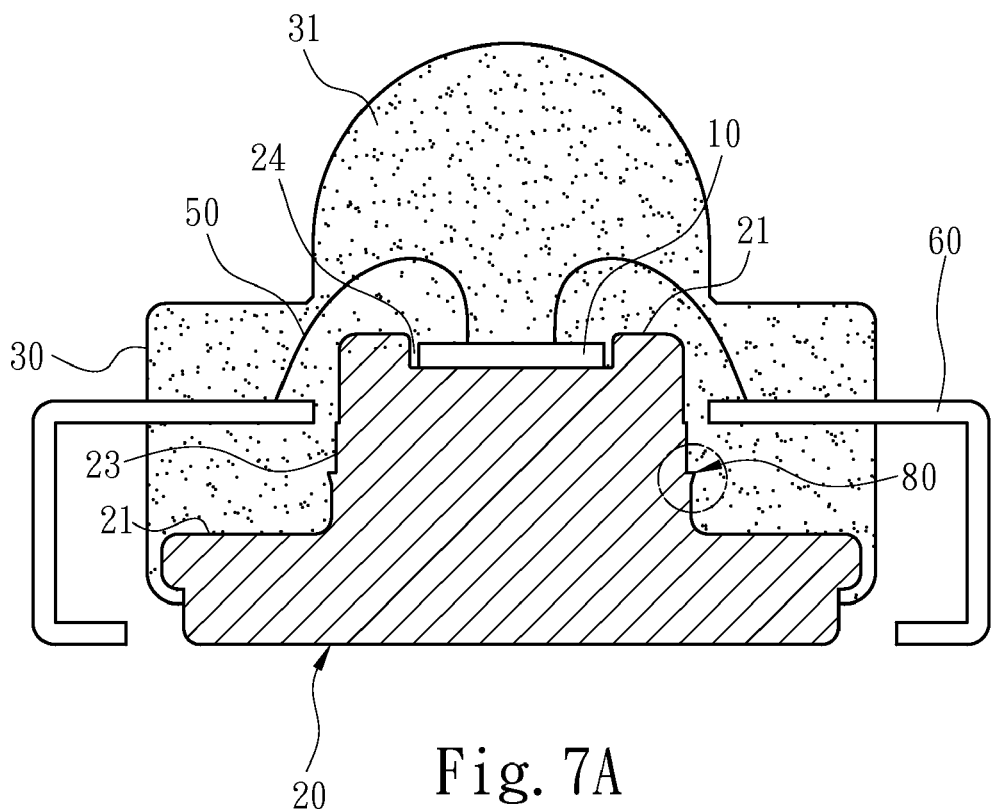
FIG. 7A is a sectional view of the third embodiment of the invention.
Figure 7B:
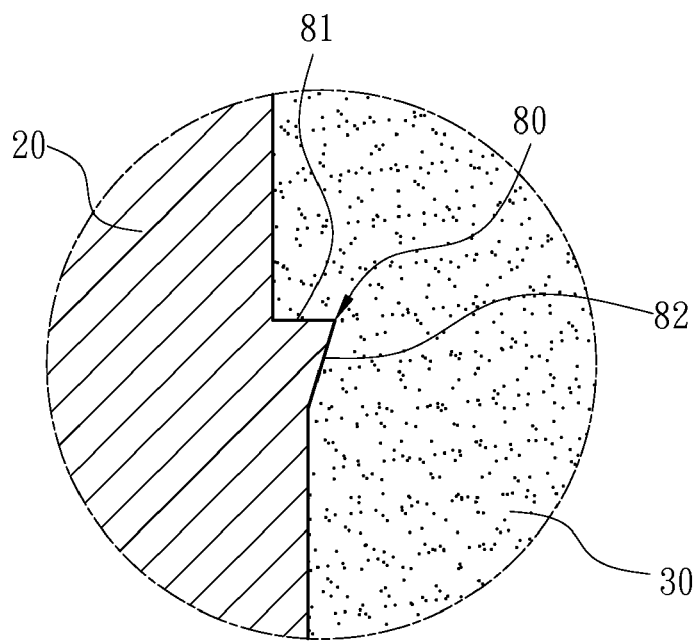
FIG. 7B is a fragmentary enlarged cross section of the third embodiment of the invention.
Figure 8:
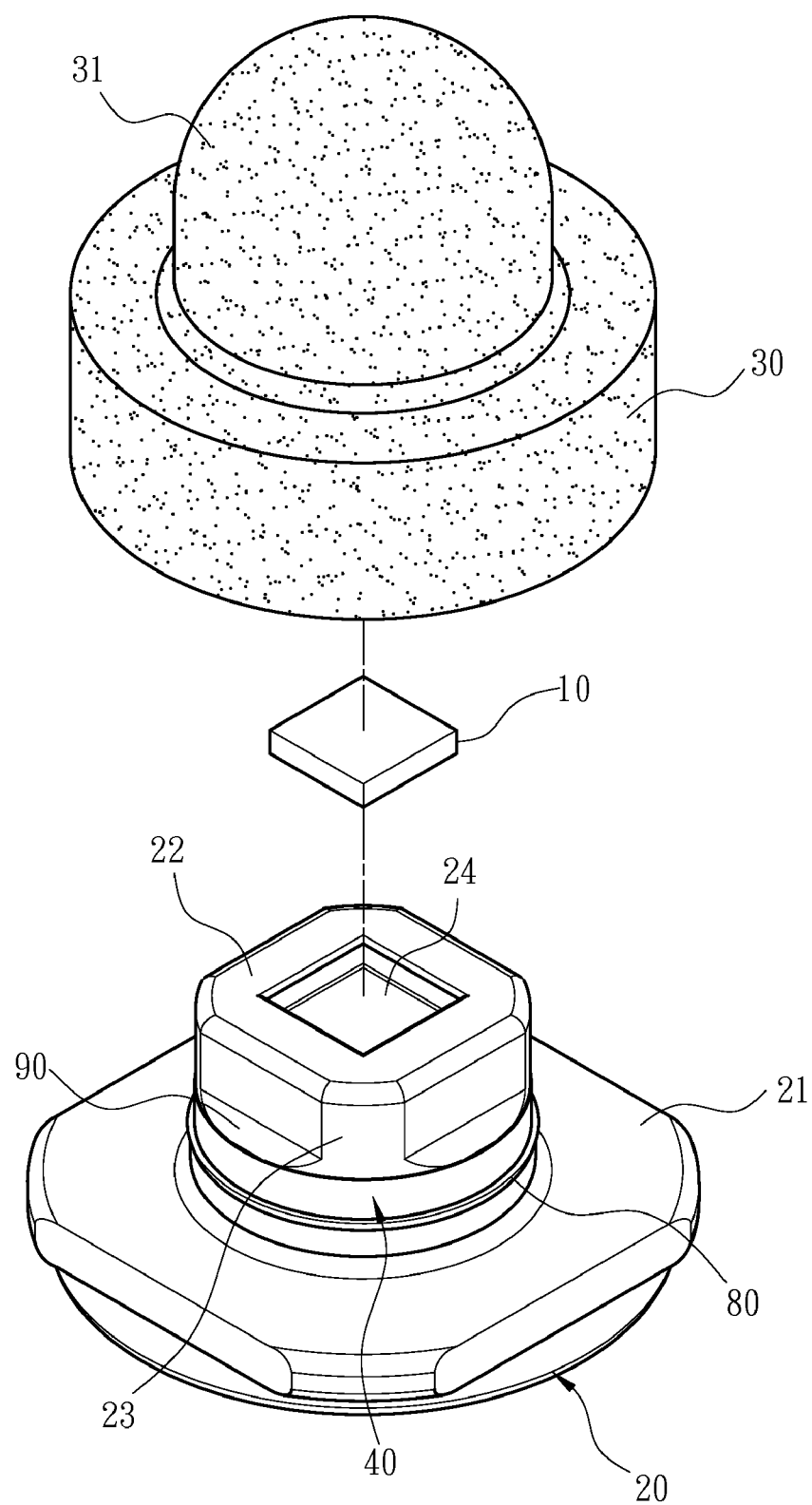
FIG. 8 is another perspective view of the third embodiment of the invention.

Please refer to FIG. 6 for a third embodiment of the invention. In this embodiment, the retaining structure 40 has at least two retaining planes 90 and two retaining members 80 located between the retaining planes 90. Two neighboring retaining plane 90 and retaining member 80 are interposed by the elevation difference section 23 formed in an alternate manner. As shown in the drawing, each retaining member 80 is formed in an arched shape extending outwards. However, this is not the limitation. It also can be formed in an arched groove. Also referring to FIGS. 7A and 7B, each retaining member 80 has a lower edge 82 directing towards the base deck 21 and an upper edge 81 directing towards the bearing deck 22. The upper edge 81 has a greater cross section area than the lower edge 82. The bearing deck 22 also can have a holding trough 24 to hold the light emitting element 10 as previously discussed. Referring to FIG. 8, in this embodiment, the base deck 21 is formed in a square shape with arched corners.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A reinforced chip package structure, comprising:
   a light emitting element;
   a base which has a base deck and a jutting bearing deck on the base deck to hold the light emitting element, the base deck and the bearing deck being interposed by an elevation difference section, the elevation difference section integrally forming an annular retaining structure on the vertical surface thereof, and
   a package member which is located on the base and encompasses the bearing deck and the retaining structure and has an anchor structure corresponding to and latching the retaining structure to harness the base and the package member from moving relative to each other.

2. The reinforced chip package structure of claim 1, wherein the retaining structure has an annular groove formed around the elevation difference section.

3. The reinforced chip package structure of claim 1, wherein the bearing deck has a holding trough to hold the light emitting element.

4. The reinforced chip package structure of claim 1, wherein the package member has a lens portion corresponding to the light emitting element.

5. The reinforced chip package structure of claim 1, wherein the retaining structure has an annular ridge formed around the elevation difference section.

6. The reinforced chip package structure of claim 5, wherein the annular ridge has a lower edge directing towards the base deck and an upper edge directing towards the bearing deck, the upper edge having a greater cross section area than the lower edge.

7. The reinforced chip package structure of claim 1, wherein the retaining structure includes at least two wedge members which are separated and located at different levels.

8. The reinforced chip package structure of claim 7, wherein the wedge members have distal ends located on the same vertical surface.

9. The reinforced chip package structure of claim 7, wherein each of the wedge members is an arched groove.

10. The reinforced chip package structure of claim 7, wherein the bearing deck has a holding trough to hold the light emitting element.

11. The reinforced chip package structure of claim 7, wherein the package member has a lens portion corresponding to the light emitting element.

12. The reinforced chip package structure of claim 7, wherein each of the wedge members is formed in an arched shape extending outwards.

13. The reinforced chip package structure of claim 12, wherein each of the wedge members has a lower edge directing towards the base deck and an upper edge directing towards the bearing deck, the upper edge having a greater cross section area than the lower edge.

14. The reinforced chip package structure of claim 1, wherein the retaining structure has at least two retaining planes and two retaining members located between the retaining planes, two neighboring retaining plane and retaining member are being interposed by the elevation difference section formed in an alternate manner.

15. The reinforced chip package structure of claim 14, wherein the retaining member is formed of an arched groove.

16. The reinforced chip package structure of claim 14, wherein the bearing deck has a holding trough to hold the light emitting element.

17. The reinforced chip package structure of claim 14, wherein the package member has a lens portion corresponding to the light emitting element.

18. The reinforced chip package structure of claim 14, wherein the base deck is formed in a square shape and has arched corners.

19. The reinforced chip package structure of claim 14, wherein the retaining member is formed in an arched shape extending outwards.

20. The reinforced chip package structure of claim 19, wherein the retaining member has a lower edge directing towards the base deck and an upper edge directing towards the bearing deck, the upper edge having a greater cross section area than the lower edge.

* * * * *